(12) United States Patent
Hwang et al.

(10) Patent No.: US 10,873,306 B2
(45) Date of Patent: Dec. 22, 2020

(54) ELECTRONIC APPARATUS AND POWER CONTROLLING METHOD THEREOF

(71) Applicant: SAMSUNG ELECTRONICS CO., LTD., Suwon-si (KR)

(72) Inventors: In-woo Hwang, Gunpo-si (KR); Sun-min Kim, Yongin-si (KR); Ki-beom Kim, Yongin-si (KR); Dong-hyun Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 15/866,796

(22) Filed: Jan. 10, 2018

(65) Prior Publication Data

US 2018/0212579 A1    Jul. 26, 2018

(30) Foreign Application Priority Data

Jan. 25, 2017  (KR) .......................... 10-2017-0012271

(51) Int. Cl.
*H04R 3/00* (2006.01)
*H04S 7/00* (2006.01)
(Continued)

(52) U.S. Cl.
CPC ........... *H03G 3/002* (2013.01); *H03G 3/3005* (2013.01); *H03G 9/005* (2013.01); *H04R 3/00* (2013.01);
(Continued)

(58) Field of Classification Search
CPC ...... H03G 3/002; H03G 3/3005; H03G 9/005; H04S 7/30; H04R 3/00; H04R 2430/01; H04R 2499/15
(Continued)

(56) References Cited

U.S. PATENT DOCUMENTS 6,055,502 A * 4/2000 Kitamura ............... G10H 1/125
704/500
10,375,484 B2    8/2019 Meyer et al.
(Continued)

FOREIGN PATENT DOCUMENTS

CN    104885360 A    9/2015
JP    2008-187623    8/2008
(Continued)

OTHER PUBLICATIONS

Wikipedia, Loudness, URL capture date of Feb. 18, 2014, Internet Archive WayBack Machine.*
(Continued)

*Primary Examiner* — Vivian C Chin
*Assistant Examiner* — Con P Tran
(74) *Attorney, Agent, or Firm* — Nixon & Vanderhye P.C.

(57) ABSTRACT

An example sound output apparatus may include an input unit, an output unit, and a processor configured to perform first-filtering of a frequency band of an audio signal received through the input unit based on a sound pressure of the sound output apparatus, second-filtering of a frequency band of the first-filtered audio signal based on a frequency response characteristic of the sound output apparatus, adjust a loudness of the received audio signal based on a perception volume level of the second-filtered audio signal, and output the adjusted audio signal through the output unit.

18 Claims, 8 Drawing Sheets

(51) Int. Cl.
*H03G 3/00* (2006.01)
*H03G 9/00* (2006.01)
*H03G 3/30* (2006.01)

(52) U.S. Cl.
CPC ............ *H04S 7/30* (2013.01); *H04R 2430/01* (2013.01); *H04R 2499/15* (2013.01)

(58) Field of Classification Search
USPC .............................. 381/104, 107, 99, 98, 102
See application file for complete search history.

(56) References Cited

U.S. PATENT DOCUMENTS

| | | | | |
|---|---|---|---|---|
| 2012/0328115 | A1* | 12/2012 | Wolters | H03G 9/00 381/57 |
| 2013/0094665 | A1* | 4/2013 | Muench | H03F 1/02 381/98 |
| 2013/0272543 | A1* | 10/2013 | Tracey | H03G 3/32 381/107 |
| 2014/0321670 | A1* | 10/2014 | Nystrom | H03G 5/165 381/107 |
| 2015/0036841 | A1 | 2/2015 | Lorente et al. | |
| 2015/0146886 | A1 | 5/2015 | Baumgarte | |
| 2016/0049162 | A1 | 2/2016 | Choi et al. | |
| 2016/0049914 | A1 | 2/2016 | Choi et al. | |
| 2016/0065160 | A1 | 3/2016 | Choi et al. | |
| 2016/0248393 | A1 | 8/2016 | Seefeldt | |

FOREIGN PATENT DOCUMENTS

| | | |
|---|---|---|
| JP | 5012859 | 8/2012 |
| JP | 2013-086754 | 5/2013 |
| KR | 10-1999-006301 | 1/2001 |
| KR | 10-2002-0016169 | 3/2002 |
| KR | 10-0580196 | 5/2006 |
| KR | 10-2006-0097259 | 9/2006 |
| KR | 10-2014-0119209 | 10/2014 |
| KR | 10-1482945 B1 | 1/2015 |

OTHER PUBLICATIONS

Search Report and Written Opinion dated May 3, 2018 in counterpart International Patent Application No. PCT/KR2018/000691.
Chinese Office Action dated Oct. 28, 2020 for Chinese Application No. 201880004819.1.

* cited by examiner

ELECTRONIC APPARATUS AND POWER CONTROLLING METHOD THEREOF

CROSS-REFERENCE TO RELATED APPLICATION

This application is based on and claims priority from Korean Patent Application No. 10-2017-0012271, filed in the Korean Intellectual Property Office on Jan. 25, 2017, the entire contents of which are incorporated by reference herein.

BACKGROUND

1. Technical Field

The present disclosure generally relates to a sound output apparatus and a control method thereof, more particularly, to a sound output apparatus which outputs an audio signal and a control method thereof.

2. Description of Related Art

With the development of electronic technology, there have been many attempts to provide a user with content in an optimal state reflecting a characteristic of the content. An image apparatus such as a television (TV) and a sound apparatus such as an audio speaker, which are widely used in households, can automatically adjust the volume of content sound depending on a characteristic of the content and output the content with the adjusted sound.

However, the automatic volume adjustment technique usually cannot reflect the characteristic that a perception volume becomes different depending on whether the sound is a lower register or an upper register and a sound pressure of an electronic apparatus. Accordingly, there has been a problem that the dynamic range of an original signal is often damaged or the original sound is distorted at the volume which a user finally perceives.

SUMMARY

An aspect of example embodiments relates to a sound output apparatus which outputs an audio signal to which filtering is performed based on a sound pressure of a sound output apparatus and a frequency response characteristic, and a control method thereof.

According to an example embodiment, a sound output apparatus is provided, the sound output apparatus including an input unit (e.g., including input circuitry), an output unit (e.g., including output circuitry), and a processor configured to perform first-filtering of a frequency band of an audio signal received through the input unit based on a sound pressure of the sound output apparatus, to perform second-filtering of a frequency band of the first-filtered audio signal based on a frequency response characteristic of the sound output apparatus, to adjust a loudness of the received audio signal based on a perception volume level of the second-filtered audio signal, and to output the adjusted audio signal through the output unit.

The example sound output apparatus may further include a storage configured to store information about an output apparatus characteristic filter based on a plurality of Revised Low frequency B (RLB) weight filters for each different sound pressure of the sound output apparatus and a frequency response characteristic of the sound output apparatus, wherein the processor may perform first-filtering of a frequency band of the audio signal based on an RLB weight filter which corresponds to a sound pressure of the sound output apparatus, and perform second-filtering of a frequency band of the first-filtered audio signal based on the output apparatus characteristic filter.

The processor may adjust a loudness of the audio signal based on a perception volume level of the second-filtered audio signal by a predetermined time section unit.

The processor may determine a perception volume level according to a frequency of the second-filtered audio signal and a sound pressure of the sound output apparatus based on equal loudness contours which indicate a relation between a sound pressure level and a frequency of an audio signal.

The storage may further include shelving filter information for each different frequency of an audio signal, wherein the processor may filter the received audio signal based on the shelving filter.

If a perception volume level of the second-filtered audio signal is not included in a predetermined level section, the processor may compensate loudness of the audio signal and provide the audio signal to the output unit, and if the perception volume level is included in a predetermined level section, the processor may provide the received audio signal to the output unit.

If the perception volume level exceeds the predetermined level section, the processor may compensate the audio signal so that a perception volume level of the audio signal becomes an upper limit value in the predetermined level section, and if the perception volume level is less than the predetermined level section, the processor may compensate the audio signal so that a perception volume level of the audio signal becomes a lower limit value in the predetermined level section.

The processor may adjust at least one of an upper limit value and a lower limit value in the predetermined level section based on at least one of a type of the audio signal, a current time, a surrounding noise level, and a user preference.

The example sound output apparatus may be implemented as at least one of a woofer, a midrange speaker, and a tweeter.

An example control method for a sound output apparatus includes receiving an audio signal, first-filtering of a frequency band of the audio signal based on a sound pressure of the sound output apparatus, second-filtering of the first-filtered audio signal based on a frequency response characteristic of the sound output apparatus, adjusting a loudness of the received audio signal based on a perception volume level of the second-filtered audio signal, and outputting the adjusted audio signal.

The example sound output method may use information about an output apparatus characteristic filter based on a plurality of RLB weight filters for each different sound pressure of the sound output apparatus and a frequency response characteristic of the sound output apparatus, wherein the first-filtering may include first-filtering of a frequency band of the audio signal based on an RLB weight filter which corresponds to a sound pressure of the sound output apparatus, and the second-filtering may include second-filtering of a frequency band of the first-filtered audio signal based on the output apparatus characteristic filter.

The adjusting of loudness of the received audio signal may include adjusting a loudness of the audio signal based on a perception volume level of the second-filtered audio signal by a predetermined time section unit.

The adjusting of loudness of the received audio signal may include determining a perception volume level according to a frequency of the second-filtered audio signal and a sound pressure of the sound output apparatus based on equal loudness contours which indicate a relation between a sound pressure level and a frequency of an audio signal.

The example sound output method may further use shelving filter information for each different frequency of an audio signal, and the method may further include filtering the received audio signal based on the shelving filter.

The adjusting of loudness of the received audio signal may include applying a compensation gain to a loudness of the received audio signal if a perception volume level of the second-filtered audio signal is not included in a predetermined level section, and not applying a compensation gain to a loudness of the received audio signal if the perception volume level is included in a predetermined level section.

The adjusting of loudness of the received audio signal may include applying a compensation gain to a loudness of the audio signal so that a perception volume level of the audio signal becomes an upper limit value in the predetermined level section if the perception volume level exceeds the predetermined level section, and applying a compensation gain to a loudness of the audio signal so that a perception volume level of the audio signal becomes a lower limit value in the predetermined level section if the perception volume level is less than the predetermined level section.

The predetermined level section may be adjusted based on at least one of a type of the audio signal, a current time, a surrounding noise level, and a user preference.

The sound output method may be implemented for at least one of a woofer, a midrange speaker, and a tweeter.

According to the example embodiments described above, a dynamic range of an original sound may be maintained when a normalization of an audio signal is performed.

DETAILED DESCRIPTION

Hereinafter, various example embodiments will be described in greater detail with reference to the accompanying drawings. For reference, when the detailed description of known functions or configurations might obscure the gist of the embodiments in describing them, such detailed description thereof will be omitted. In addition, the example embodiments may be changed in various forms, and the technical scope is not limited to the following example embodiments. Rather, these example embodiments are provided to make the present disclosure thorough and complete.

In addition, it will be understood that, when a certain part "includes" a certain element, other element(s) are not excluded from the certain part and the certain part may further include other element(s) unless this term is defined otherwise. Also, various elements and regions in the drawings are schematically drawn. The technical ideas of the present disclosure are not limited by a relative size or interval drawn in the accompanying drawings.

Figure 1:
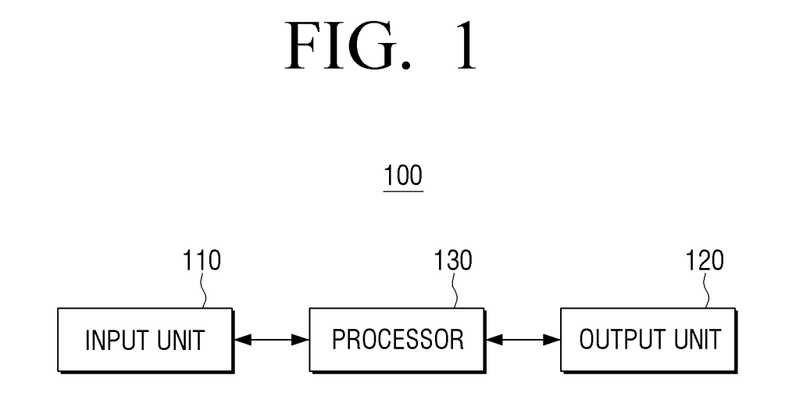
FIG. 1 is a block diagram illustrating a configuration of a sound output apparatus according to an example embodiment.

FIG. 1 is a block diagram illustrating a configuration of a sound output apparatus according to an example embodiment.

According to FIG. 1, the sound output apparatus 100 may include an input unit (e.g., including input circuitry) 110, an output unit (e.g., including output circuitry) 120 and a processor 130.

The sound output apparatus 100 may be implemented as various electronic apparatuses capable of outputting an audio signal. For example and without limitation, the sound output apparatus 100 may be implemented as a display apparatus which includes at least one speaker, such as a TV, a speaker apparatus, or the like. In this case, the sound output apparatus 100 may receive an audio signal, and process the audio signal in accordance with various example embodiments, and output the audio signal through a speaker. However, the example embodiments are not limited to the above example. The sound output apparatus 100 may be implemented to process an audio signal in accordance with an example embodiment and to transmit the audio signal to an external output apparatus (not illustrated) connected with the sound output apparatus 100 via cable or wirelessly. Below, for ease of description, the example of a sound output apparatus 100 which includes speakers and directly outputs an audio signal will be described.

The input unit 110 may receive an audio signal. For example, the input unit 110 may receive an audio signal from an external apparatus, an external server, or the like, by a communication method such as Wi-Fi based on an access point (AP) (wireless LAN network, etc.), Bluetooth, ZigBee, a local area network (LAN), a wide area network (WAN), Ethernet, IEEE 1394, HDMI, USB, or the like. The audio signal may be various forms of voice content or audio content such as, without limitation, music, video, a radio broadcast, a terrestrial broadcast, a voice signal of a counterpart during a call, or the like. The audio signal may also be content pre-stored in the sound output apparatus 100.

The output unit 120 may output an audio signal. For example, the output unit 120 may include at least one speaker unit (e.g., including a speaker and associated circuitry such as an audio amplifier).

For example, the output unit 120 may include at least one of a woofer, a midrange speaker and a tweeter, but the example embodiments are not limited thereto. The output unit 120 may also include a plurality of speakers. For example, the sound output apparatus 100 may be implemented as a multi-way system in which a range of a reproduction band is divided into a low range, a middle range, and a high range, and an appropriate audio signal is allocated to each range. As an example, if the sound output apparatus 100 is implemented as a three-way system in which the sound ranges are allocated into three speakers, the output unit 120 may be implemented so as to include a tweeter for reproducing a high frequency audio signal, a midrange speaker for reproducing an intermediate frequency audio signal, a woofer for reproducing a low frequency audio signal, or the like.

The processor 130 may control overall operations of the sound output apparatus 100. The processor 130 may include, without limitation, one or more of a central processing unit (CPU), a controller, an application processor (AP), a communication processor (CP), an ARM processor, processing circuitry or the processor 130 may be defined as one of the above processors. The processor 130 may also be implemented as a digital signal processor (DSP) or as a system-on-chip (SoC) in which an algorithm for processing content is provided, or as a form of field programmable gate array (FPGA). The processor 130 may perform filtering to an input audio signal, and adjust a loudness of the received audio signal based on a perception volume level of the filtered audio signal. For example, the processor 130 may select a filter for filtering a frequency band of an audio signal based on a sound pressure of the sound output apparatus 100. The sound pressure of the sound output apparatus 100 may be obtained based on the volume information of the sound output apparatus 100. As an example, the information of the sound pressure in each different volume level of the sound output apparatus 100 may be obtained by experimentation, and the information may be pre-stored. For example, if the output characteristic of the sound output apparatus 100 is high, a high sound pressure may be matched to a relatively low volume.

Accordingly, the processor 130 may select a filter for performing the first-filtering to a frequency band of an audio signal based on the volume information currently set in the sound output apparatus 100.

The processor 130 may also select a filter for filtering a frequency band of an audio signal based on a frequency response characteristic of the sound output apparatus 100. The frequency response characteristic of the sound output apparatus 100 may be the output characteristic of at least one speaker provided in the sound output apparatus 100. For example, the speaker may have a unique frequency band capable of being output in accordance with the purpose or performance of the speaker. For instance, the woofer may output the frequency band of 100 Hz~299 Hz, the mid-woofer may output the frequency band of 300~499 Hz, the squawker may output the frequency band of 500 Hz~2.9 KHz, the tweeter may output the frequency band of 3 KHz~6.9 KHz, and the super-tweeter may output the frequency band of 7 KHz~20 KHz. Thus, the processor 130 may select the second filter for performing the second-filtering on the audio signal based on the output characteristic which depends on a frequency of an output apparatus.

The processor 130 may perform the first-filtering and the second-filtering on an audio signal using the selected first filter and second filter, and adjust the loudness of the audio signal based on a perception volume level of the second-filtered audio signal.

For example, according to an example embodiment, the processor 130 may obtain a perception volume level based on an energy of the first-filtered and second-filtered audio signal, and perform an additional processing based on the obtained perception volume level. The perception volume level may be obtained by applying the mean square of a predetermined time section unit or the method prescribed in ITU-R BS. 1770 to the first-filtered and second-filtered audio signal. Also, the perception volume level may be a loudness value that is converted to a decibel-scale. The loudness may refer to the size of an audio signal in which a human psychological characteristic is reflected, not a physical strength of an audio signal. The loudness and the first filter will be described in greater detail with reference to FIGS. 2 and 3.

According to an example embodiment, the processor 130 may determine whether the obtained perception volume level is included in a predetermined level section. If the perception volume level is not included in the predetermined level section, the processor 130 may compensate the loudness of a received audio signal and provide the audio signal to the output unit 120. If the perception volume level is included in the predetermined level section, the processor 130 may provide the received audio signal as it is to the output unit 120. The predetermined level section is described in greater detail with reference to FIG. 5.

The processor 130 may decode an audio signal, and convert the decoded audio signal into a form of audio data capable of being output. The processor 130 may also perform various signal processing to an audio signal, such as amplifying, noise-filtering, etc.

The sound output apparatus 100 may further include a storage (not illustrated). The storage may store a variety of data, programs and applications for driving/controlling the sound output apparatus 100.

The storage may also store the information about an output apparatus characteristic filter based on a plurality of RLB weight filters for each different sound pressure of the sound output apparatus 100 and a frequency response characteristic of the sound output apparatus 100. Accordingly, the processor 130 may perform the first-filtering and the second-filtering using the information about the filter stored in the storage.

The storage may also store shelving filter information for each different frequency of an audio signal. Accordingly, the processor 130 may filter an audio signal using the shelving filter information. For example, the processor 130 may perform the shelving filtering to an audio signal, and perform sequentially the first-filtering and the second-filtering described above. However, the order of applying the shelving filtering, the first-filtering and the second-filtering to an audio signal is not limited to the above example, and it may be possible to perform at least one of the shelving filtering, the first-filtering and the second-filtering to an audio signal. For example, the processor 130 may perform the first-filtering to an audio signal after performing the second-filtering. The shelving filter will be described in greater detail with reference to FIG. 4.

Figure 2:
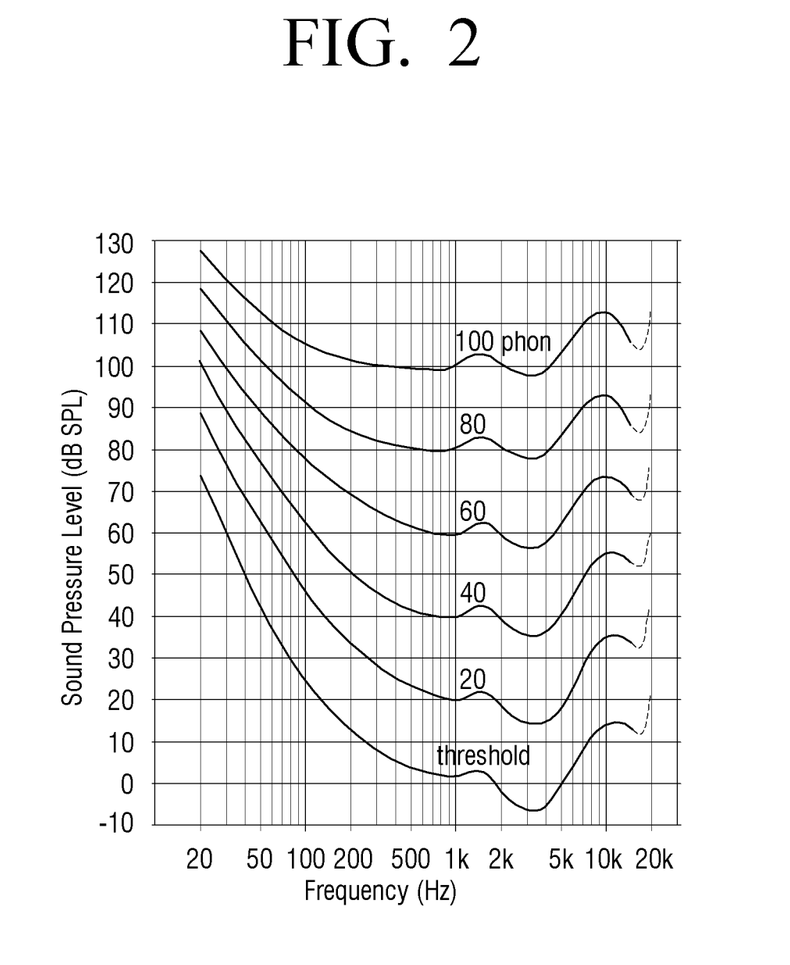
FIG. 2 is a graph of equal loudness contours which indicate a relationship between a sound pressure level and a frequency of an audio signal.

FIG. 2 is a graph of equal loudness contours which indicate a relation between a sound pressure and a frequency of an audio signal.

The equal loudness contours may show characteristics of human hearing. The Y-axis of the graph may be a sound pressure level (SPL), which indicates a pressure of sound measured in dB unit with reference to a minimum audible limit level. The X-axis of the graph may be a frequency of an audio signal.

Referring to the equal loudness contours, even when an audio signal has the same dB level, the loudness of sound which a user actually perceives may be different depending on a frequency of an audio signal. In other words, the strength of physically measured sound may be inconsistent with the loudness of sound that is actually perceived by a human auditory system. For example, when a person hears the 70 dB sound at 50 Hz and the 70 dB sound at 200 hz, the human auditory system may perceive the 70 dB sound in 200 Hz more loudly. A person may also perceive the loudness of the 60 dB sound at 1 kHz and that of the 70 dB sound at 200 hz as being the same.

According to an example embodiment, the processor 130 may determine the loudness of an audio signal based on a frequency of an audio signal and a sound pressure of the sound output apparatus 100. The loudness may refer to a subjective level of loudness which a human auditory system perceives when a certain sound is delivered to the ears.

A sound pressure of the sound output apparatus 100 may be identified based on the volume information of the sound output apparatus 100. For example, according to an example embodiment, the storage may store the information of the sound pressure matched to the volume level of the sound output apparatus 100. Accordingly, the processor 130 may determine the loudness of an audio signal based on the sound pressure matched to the volume of the sound output apparatus 100, a frequency of an audio signal and the equal loudness contours.

The processor 130 may calculate a perception volume level using at least one from among an average value, a middle value, a mode and a mean square. The perception volume level may refer to a loudness of an audio signal which is determined based on the sound pressure matched to the volume of the sound output apparatus 100, a frequency of an audio signal and the equal loudness contours. The method for applying to an audio signal an RLB weight filter which corresponds to a sound pressure of a sound output apparatus will be described below.

Figure 3:
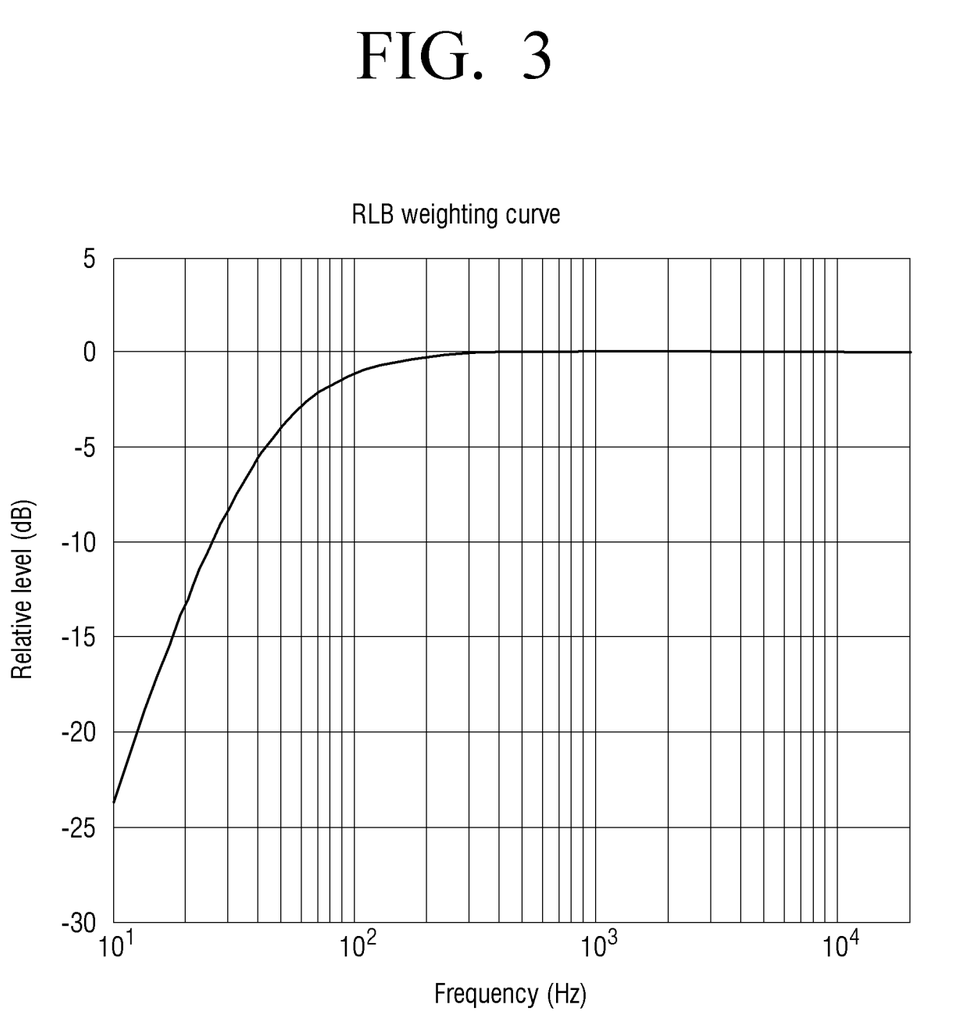
FIG. 3 is a graph showing an RLB weight filter according to an example embodiment.

FIG. 3 is a graph showing an RLB weight filter according to an example embodiment.

The RLB weight filter (an RLB weighting curve) illustrated in FIG. 3 is a non-limiting example of a weight filter based on the characteristic of a human auditory system. According to an example embodiment, the processor 130 may design the RLB weight filter to perform similar filtering as in the filtering in which the equal loudness contours defined in ISO 226:2003 are reversed and the reversed equal loudness contours are applied. For example, as indicated in the equal loudness contours illustrated in FIG. 2, at a low decibel, a human auditory system may not properly perceive the low frequency less than 250 Hz. Thus, the RLB weight filter illustrated in FIG. 3 may be designed to decrease the weight of a low frequency region and to increase a relative weight of the frequency band equal to or higher than 1 kHz compared to a low frequency region.

As illustrated above, the information about the RLB weight filter which corresponds to the sound pressure of the sound output apparatus 100 may be pre-stored in the storage. Accordingly, the processor 130 may obtain the RLB weight filter which corresponds to the sound pressure of the sound output apparatus 100 from the storage, and perform the first-filtering on the frequency band of an audio signal based on the obtained RLB weight filter.

According to an example embodiment, the processor 130 may perform the second-filtering on the first-filtered audio signal. The second-filtering may be filtering using a second filter which is designed based on a frequency response characteristic of the sound output apparatus 100.

As described above, the speakers included in the sound output apparatus 100 may have different output characteristics for different frequencies depending on the purpose and performance of the speaker. For example, a woofer may output a frequency between 40 Hz and 500 Hz, a midrange speaker may output a frequency between 250 Hz and 2 kHz, and a tweeter may output a frequency between 2 kHz and 20 kHz. The sound output apparatus 100 may, in general, output all the frequency bands using the plurality of speakers above. The frequency response characteristic of the output apparatus may be determined by the combination and characteristics of the speakers used in the output apparatus.

Thus, the processor 130 may design an output apparatus characteristic filter in which a frequency response characteristic, which is an output characteristic which depends on each different frequency band, is reflected, and use the output apparatus characteristic filter in the second-filtering of an audio signal.

As described above, the information about the output apparatus characteristic filter based on a frequency response characteristic may be pre-stored in the storage. Accordingly, the processor 130 may obtain from the storage the information about the output apparatus characteristic filter which corresponds to the frequency response characteristic of the sound output apparatus, and perform the second-filtering based on the obtained output apparatus characteristic filter.

In addition to the first-filtering and the second-filtering, the shelving filtering performed by the processor 130 will be described below.

Figure 4:
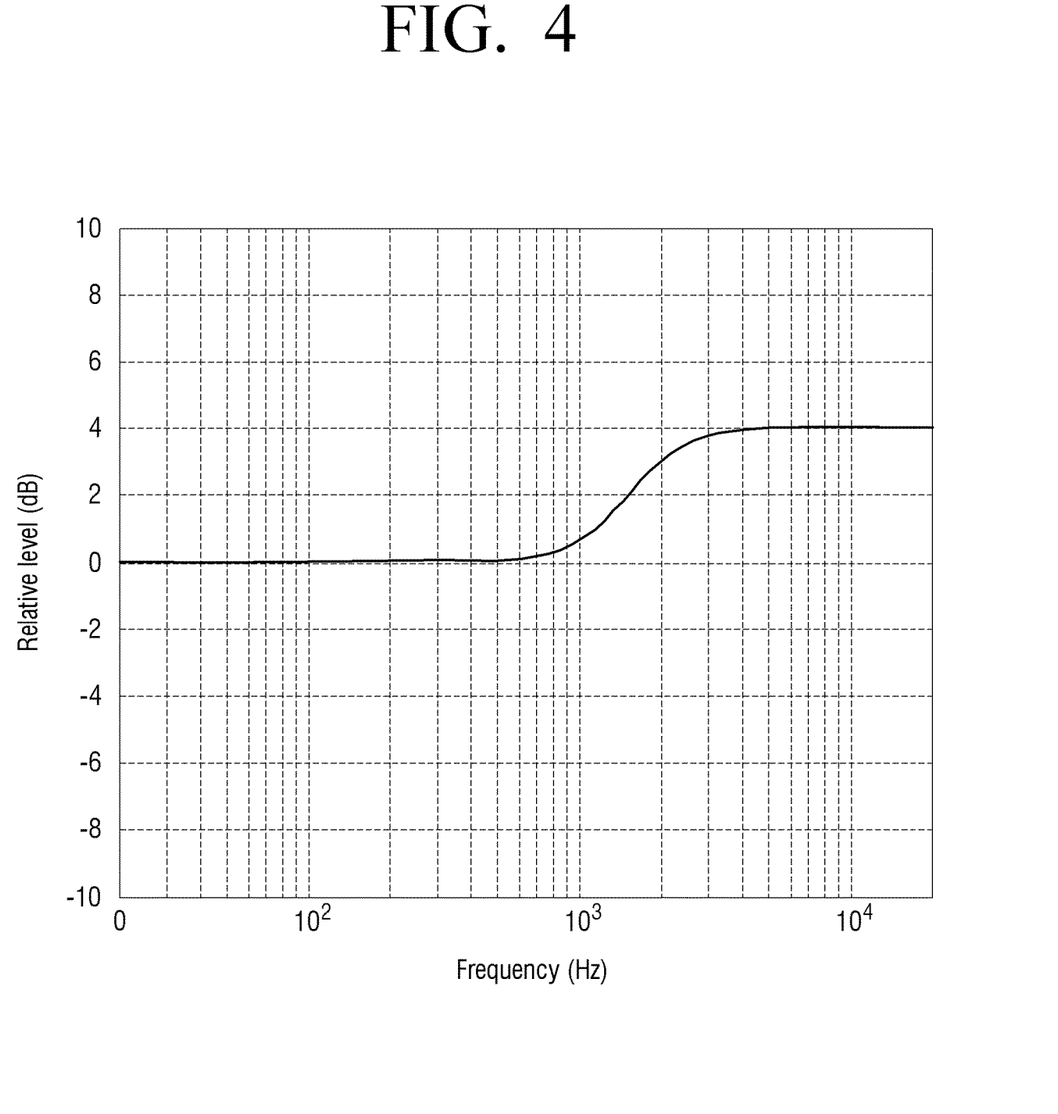
FIG. 4 is a graph showing a shelving filter according to an example embodiment.

FIG. 4 is a graph showing the shelving filter according to an example embodiment.

The shelving filter illustrated in FIG. 4 is an example of a filter in which a sound perception characteristic based on a human head shape is reflected.

As prescribed in ITU-R BS. 1770, with reference to 1 kHz, the shelving filter for 48 kHz, which is generally used in a broadcasting program, may pass the audio signal less than 1 kHz as it is, and give a gain of 0-4 dB to the audio signal equal to or higher than 1 kHz and pass the audio signal.

According to an example embodiment, the processor 130 may perform the shelving filtering to a received audio signal, and perform the first-filtering and the second-filtering. However, the order of performing the shelving filtering, the first-filtering and the second-filtering is not limited to the above example, and it is not compulsory to perform all the filterings to an audio signal.

A specific example method for determining whether a perception volume level of a filtered audio is included in a predetermined level section and adjusting a loudness of a received audio signal will be described below.

Figure 5:
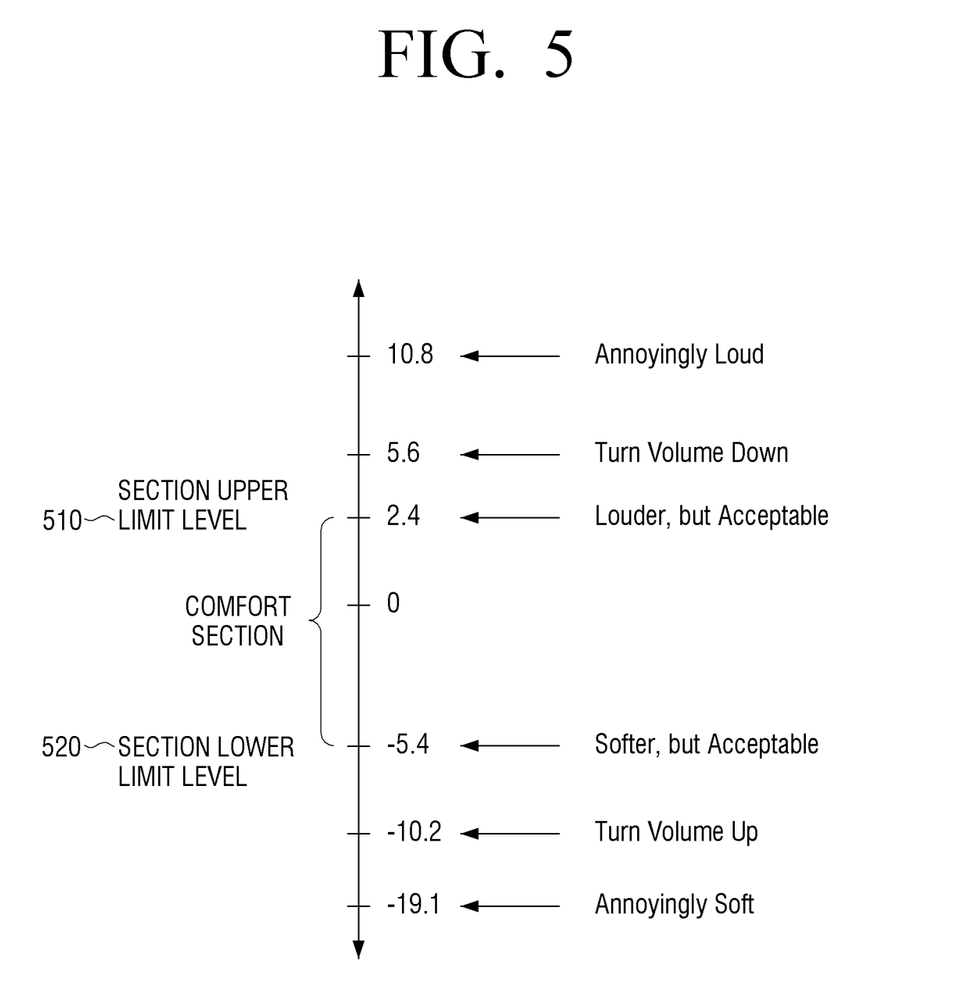
FIG. 5 is a diagram illustrating a predetermined level section according to an example embodiment.

FIG. 5 is a diagram illustrating a predetermined level section according to an example embodiment.

The processor 130 may obtain a perception volume level based on the energy of the first-filtered and second-filtered audio signal. For example, the perception volume level may be obtained by applying the mean square of a predetermined time section unit or the method prescribed in ITU-R BS. 1770 to the first-filtered and second-filtered audio signal. Hence, the perception volume level may be the mean square of a filtered audio signal, or may be obtained by multiplying the mean square by a weighting coefficient and converting the multiplied value into a decibel scale. The weighting coefficient may refer to the coefficient in which the factors of changes in loudness of sound is reflected, the factors which are affected by a body part in each different direction of sound reaching to a human auditory system.

The comfort section illustrated in FIG. 5 may indicate a predetermined level section. According to an example embodiment, the predetermined level section may have the section upper limit level 510 of +2.4 [dB], and the section lower limit level 520 of −5.4 [dB] with reference to the target level (0). For example, if the target level is −24 [dB], the section upper limit level 510 is 21.6 [dB], and the section lower limit level 520 is −29.4 [dB].

The predetermined level section may be the level section in which, when a user perceives an output audio signal, the user may not feel discomfort. For example, a user may perceive the audio signal of a sound level higher than the target level by 10.8 [dB] as very (annoyingly) loud, and perceive the audio signal of a sound level lower than the target level by 19.1 [dB] as very (annoyingly) soft. Thus, when an audio signal which corresponds to certain content is output, if the audio signal is out of a predetermined level section, a user may feel the need for adjusting the volume of the sound output apparatus 100.

According to an example embodiment, if the obtained perception volume level is not included in a predetermined level section, the processor 130 may adjust a loudness of a received audio signal by compensating the loudness of the received audio signal so that a perception volume level may be included in a predetermined level section. In other words, the processor 130 may apply a compensation gain value to the loudness of an audio signal so that the perception volume level of an audio signal may be included in a predetermined level section. For example, if the upper limit value of a predetermined level section is 21.6 [dB] and the perception volume level is 30 [dB], the processor 130 may subtract 8.4 [dB] from the loudness of an audio signal (8.4 [dB] being obtained from '30 [dB] minus 21.6 [dB]'). Hence, the compensation gain value may be obtained by subtracting a target level [dB] from a perception volume level [dB]. Also, if a perception volume level is included in a predetermined level section, the compensation gain value may be 0 [dB], and the sound output apparatus 100 may output a received audio signal.

For example, if the perception volume level exceeds a predetermined level section, the processor 130 may compensate the loudness of an audio signal so that the perception volume level of an audio signal becomes consistent with the upper limit value of a predetermined level section (the section upper limit level 510). If the perception volume level is less than a predetermined level section, the processor 130 may compensate the loudness of an audio signal so that the perception volume level of an audio signal becomes consistent with the lower limit value of a predetermined level section (the section lower limit level 520). For example, if the perception volume level is greater than 5.6 [dB] with reference to a target level, the processor 130 may apply a compensation gain value to the loudness so that the perception volume level becomes consistent with the value 2.4 [dB]. Accordingly, a user may not feel the need to reduce the volume.

According to an example embodiment, the processor 130 may adjust a predetermined level section based on at least one of a type of an audio signal, a current time, a surrounding noise level and a user preference. For example, if a time of using the sound output apparatus 100 and a surrounding noise level, etc. change, a predetermined level section may need to be changed accordingly. For example, in the night time or at daybreak when a human auditory system becomes sensitive to the changes in loudness of an audio signal, the processor 130 may adjust the section upper limit level 510 and the section lower limit level 520 to become close to a target level. Also, if the surrounding noise level of the sound output apparatus 100 is high, the processor 130 may change a target level, and output the audio signal adjusted to a relatively high decibel. The predetermined level section may also be changed in accordance with a user settings.

The type of an audio signal may refer to a genre of audio content which the sound output apparatus 100 is reproducing or a type of an external apparatus which transmits an audio signal, or the like. For example, the processor 130 may set a predetermined level section differently in a case in which an audio signal is a broadcasting program signal received through a set-top box or an antenna and in the case in which an audio signal is received through a BluRay Disc Player (BDP) or a DVD player, etc.

Figure 6:
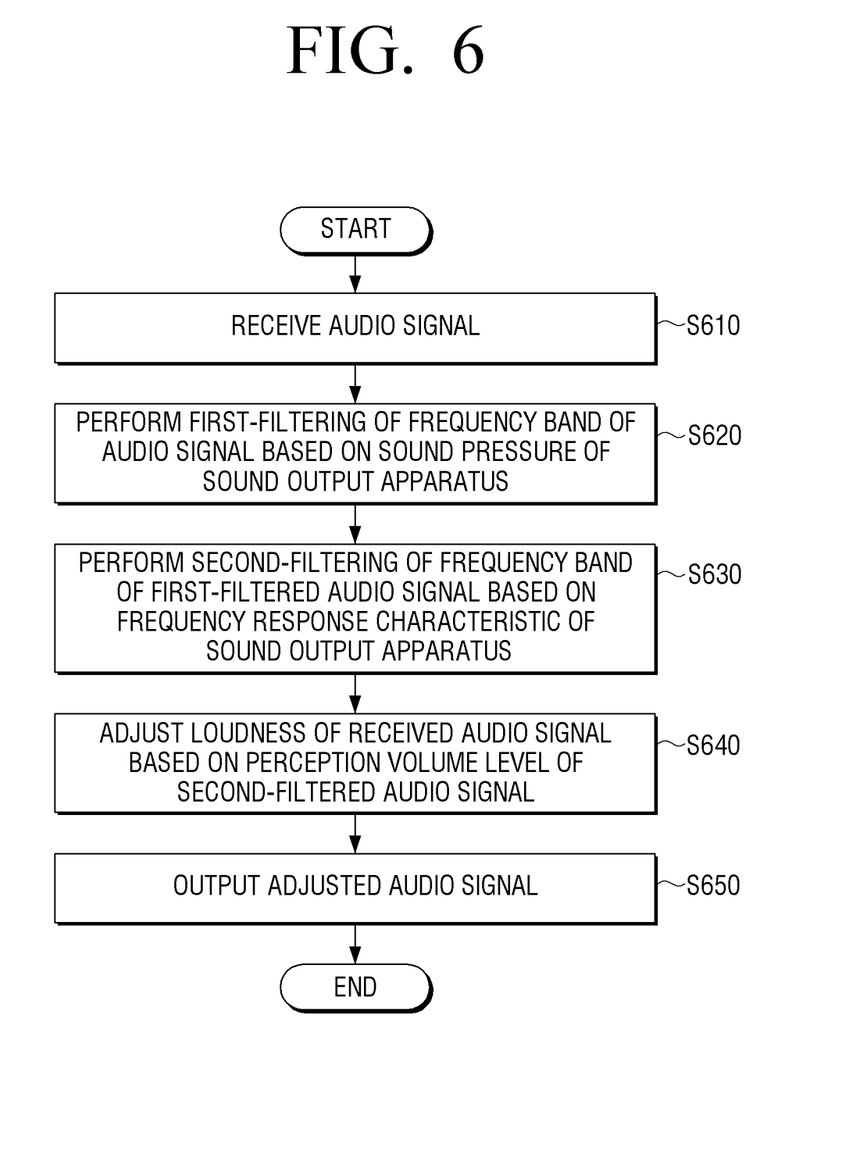
FIG. 6 is a flowchart illustrating a control method of a sound output apparatus according to an example embodiment.

FIG. 6 is a flowchart illustrating a control method of a sound output apparatus according to an example embodiment.

According to FIG. 6, the example control method of the sound output apparatus may include receiving an audio signal (S610) and performing first-filtering of a frequency band based on a frequency of an audio signal and a sound pressure of the sound output apparatus (S620).

Second-filtering may be performed to a frequency band of the first-filtered audio signal based on a frequency response characteristic of the sound output apparatus (S630).

The loudness of an audio signal may be adjusted based on a perception volume level of the second-filtered audio signal (S640).

The adjusted audio signal may be output (S650).

The sound output apparatus may include information about an output apparatus characteristic filter based on a plurality of RLB weight filters for each different sound pressure of the sound output apparatus and a frequency response characteristic of the sound output apparatus.

In the first-filtering (S620), the first-filtering of a frequency band of the audio signal may be performed based on an RLB weight filter which corresponds to a sound pressure of the sound output apparatus.

In the second-filtering (S630), the second-filtering of a frequency of the first-filtered audio signal may be performed based on the output apparatus characteristic filter.

In the adjusting a loudness (S640), the loudness of the audio signal may be adjusted based on the perception volume level of the second-filtered audio signal by a predetermined time section unit.

Also, in the adjusting of loudness (S640), a perception volume level according to a frequency of the second-filtered audio signal and a sound pressure of the sound output apparatus may be determined based on equal loudness contours which indicate a relationship between a sound pressure level and a frequency of an audio signal.

The sound output apparatus may further include shelving filter information for each different frequency of an audio signal, and the control method may further include filtering the received audio signal based on the shelving filter.

In the adjusting of loudness (S640), if a perception volume level of the second-filtered audio signal is not included in a predetermined level section, a compensation gain may be applied to the loudness of the second-filtered audio signal, and if the perception volume level is included in a predetermined level section, a compensation gain may not be applied to the loudness of the audio signal.

Also, in the adjusting of loudness (S640), if the perception volume level exceeds the predetermined level section, a compensation gain may be applied to a loudness of the audio signal so that a perception volume level of the audio signal becomes an upper limit value in the predetermined level section, and if the perception volume level is less than the predetermined level section, a compensation gain may be applied to a loudness of the audio signal so that a perception volume level of the audio signal becomes a lower limit value in the predetermined level section.

The predetermined level section may be adjusted based on at least one of a type of the audio signal, a current time, a surrounding noise level, and a user preference.

The sound output apparatus may be implemented as at least one of a woofer, a midrange speaker, and a tweeter.

A method for compensating a loudness of an audio signal for a perception volume level of an audio signal to be included in a predetermined level section will be described in greater detail below.

Figure 7:
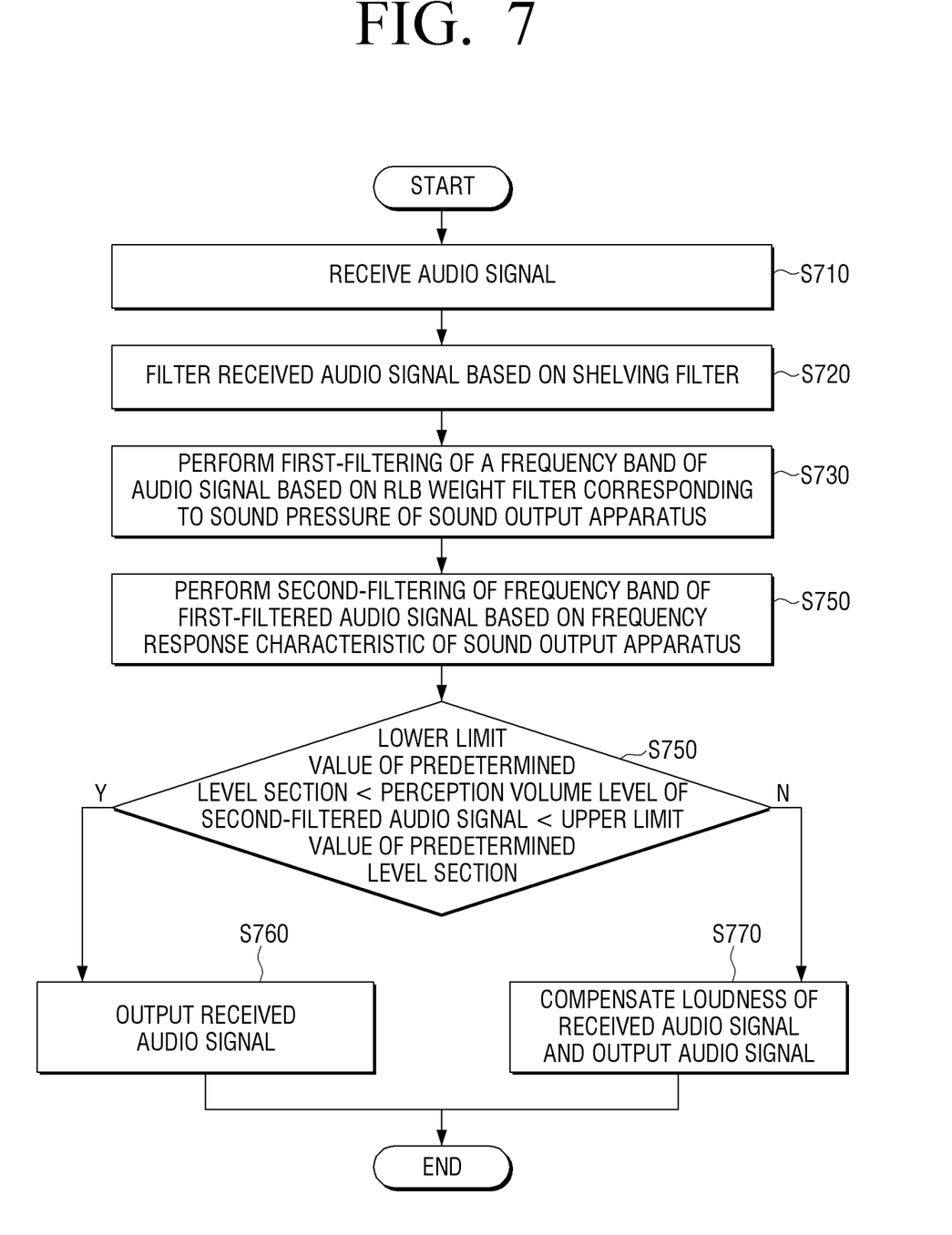
FIG. 7 is a flowchart illustrating a control method of a sound output apparatus for compensating a loudness of an audio signal and outputting the audio signal according to an example embodiment.

FIG. 7 is a flowchart illustrating an example control method of a sound output apparatus which compensates a loudness of an audio signal and outputs the audio signal.

According to FIG. 7, the example control method of the sound output apparatus may include receiving an audio signal (S710), and filtering the received audio signal based on a shelving filter (S720).

The first-filtering may be performed to a frequency band of an audio signal based on an RLB weight filter which corresponds to a sound pressure of the sound output apparatus (S730).

The second-filtering of a frequency band of the first-filtered audio signal may be performed based on a frequency response characteristic of the sound output apparatus (S740).

If a perception volume level of the second-filtered audio signal is included in a predetermined level section (S750:Y), the received audio signal may be output (S760).

If the obtained perception volume level is not included in a predetermined level section (S750:N), the loudness of the received audio signal may be compensated and the audio signal may be output (S770).

Figure 8:
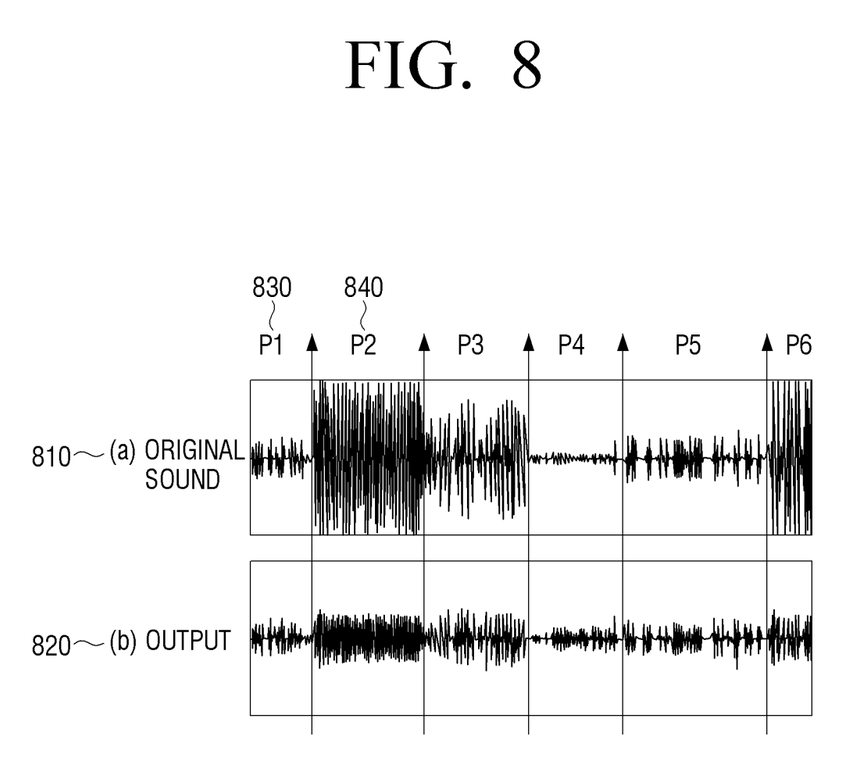
FIG. 8 is a diagram showing a comparison between a received audio signal and a compensated audio signal according to an example embodiment.

FIG. 8 is a diagram showing a comparison between a received audio signal and a compensated audio signal.

As illustrated in FIG. 8, a received audio signal, which is an original sound 810, may have a very wide dynamic range in the sections P1 (830) to P6. Accordingly, if the original sound 810 is output as it is, a user may feel the need to reduce the volume of the sound output apparatus in the sections P2 (840) and P6, and may feel the need to increase the volume of the sound output apparatus in the section P4.

According to one or more example embodiments, however, the audio signal to which a signal processing is performed, that is, an output signal 820, may have a perception volume level which is within a predetermined level section. For example, the audio signal in the section P2 (840) may have a loudness higher than the loudness of the audio signal in the section P1 (830), and accordingly, the dynamic range of the original sound 810 may be provided to a user within the scope in which the user does not feel the need to reduce the volume.

The one or more example embodiments described above may be implemented by a software/hardware upgrade to a sound output apparatus.

Also, a non-transitory computer readable medium in which a program performing the control method sequentially in accordance with the example embodiments may be provided.

A non-transitory computer readable medium may refer to a machine-readable medium or device which stores data, such as a register, cache, memory, and the like. The aforementioned various applications or programs may be stored in a non-transitory computer readable medium such as a compact disc (CD), a digital versatile disc (DVD), a hard disk, a Blu-ray disc, a Universal Serial Bus (USB) stick, a memory card, a ROM, etc.

The foregoing example embodiments and advantages are merely examples and are not to be construed as limiting the present disclosure. The description of the example embodiments is intended to be illustrative, and not to limit the scope of the present disclosure, as defined by the appended claims, and many alternatives, modifications, and variations will be apparent to those skilled in the art.

What is claimed is:

1. A sound output apparatus comprising:
an input unit including input circuitry;
an output unit including output circuitry; and
a processor configured to:
perform first-filtering of a frequency band of an audio signal received through the input unit via a filter, wherein the filter for the first-filtering is selected from a plurality of stored filters based on a sound pressure of the sound output apparatus that is determined obtained based on volume information of the sound output apparatus,
perform second-filtering of a frequency band of the first-filtered audio signal via another filter, the another filter for the second-filtering being based on a frequency response characteristic of the sound output apparatus,
adjust a loudness of the received audio signal based on a perception volume level of the second-filtered audio signal, and
output the adjusted audio signal through the output unit.

2. The sound output apparatus of claim 1, further comprising:
a storage configured to store information relating to an output apparatus characteristic filter based on a plurality of Revised Low frequency B (RLB) weight filters for each different sound pressure of the sound output apparatus and the frequency response characteristic of the sound output apparatus,
wherein the processor is configured to perform first-filtering of the frequency band of the audio signal based on an RLB weight filter which corresponds to the sound pressure of the sound output apparatus, and perform second-filtering of the frequency band of the first-filtered audio signal based on the output apparatus characteristic filter.

3. The sound output apparatus of claim 2, wherein the processor is configured to adjust a loudness of the audio signal based on the perception volume level of the second-filtered audio signal by a predetermined time section unit.

4. The sound output apparatus of claim 2, wherein the processor is configured to identify the perception volume level according to a frequency of the second-filtered audio signal and a sound pressure of the sound output apparatus based on equal loudness contours which indicate a relationship between a sound pressure level and a frequency of an audio signal.

5. The sound output apparatus of claim 2, wherein the storage further includes shelving filter information for each different frequency of an audio signal, and wherein the processor is configured to filter the received audio signal based on the shelving filter.

6. The sound output apparatus of claim 1, wherein if a perception volume level of the second-filtered audio signal is not included in a predetermined level section, the processor is configured to compensate a loudness of the audio signal and provide the audio signal to the output unit, and if the perception volume level is included in a predetermined level section, the processor is configured to provide the received audio signal to the output unit.

7. The sound output apparatus of claim 6, wherein if the perception volume level exceeds the predetermined level section, the processor is configured to compensate the audio signal so that a perception volume level of the audio signal becomes an upper limit value in the predetermined level section, and if the perception volume level is less than the predetermined level section, the processor is configured to compensate the audio signal so that a perception volume level of the audio signal becomes a lower limit value in the predetermined level section.

8. The sound output apparatus of claim 6, wherein the processor is configured to adjust at least one of an upper limit value and a lower limit value in the predetermined level section based on at least one of a type of the audio signal, a current time, a surrounding noise level, and a user preference.

9. The sound output apparatus of claim 1, wherein the sound output apparatus is implemented as at least one of a woofer, a midrange speaker, and a tweeter.

10. A control method of a sound output apparatus, the method comprising:
    receiving an audio signal;
    first-filtering a frequency band of the audio signal via a filter, wherein the filter for the first-filtering is selected based on a sound pressure of the sound output apparatus, that is obtained based on volume information of the sound output apparatus;
    second-filtering of the first-filtered audio signal via another filter, the another filter for the second-filtering being selected based on a frequency response characteristic of the sound output apparatus;
    adjusting a loudness of the received audio signal based on a perception volume level of the second-filtered audio signal; and
    outputting the adjusted audio signal.

11. The method of claim 10, further comprising storing information about an output apparatus characteristic filter based on a plurality of Revised Low frequency B (RLB) weight filters for each different sound pressure of the sound output apparatus and a frequency response characteristic of the sound output apparatus,
    wherein the first-filtering comprises first-filtering of the frequency band of the audio signal based on an RLB weight filter which corresponds to a sound pressure of the sound output apparatus, and
    wherein the second-filtering comprises second-filtering of a frequency band of the first-filtered audio signal based on the output apparatus characteristic filter.

12. The method of claim 11, wherein the adjusting of loudness of the received audio signal comprises adjusting a loudness of the audio signal based on a perception volume level of the second-filtered audio signal by a predetermined time section unit.

13. The method of claim 11, wherein the adjusting of loudness of the received audio signal comprises identifying the perception volume level according to a frequency of the second-filtered audio signal and a sound pressure of the sound output apparatus based on equal loudness contours which indicate a relationship between a sound pressure level and a frequency of an audio signal.

14. The method of claim 11, further comprising storing shelving filter information for each different frequency of an audio signal, and
    wherein the method further comprises filtering the received audio signal based on the shelving filter information.

15. The method of claim 10, wherein the adjusting of loudness of the received audio signal comprises applying a compensation gain to a loudness of the received audio signal if a perception volume level of the second-filtered audio signal is not included in a predetermined level section, and not applying a compensation gain to a loudness of the received audio signal if the perception volume level is included in a predetermined level section.

16. The method of claim 15, wherein the adjusting of loudness of the received audio signal comprises applying a compensation gain to a loudness of the audio signal so that a perception volume level of the audio signal becomes an upper limit value in the predetermined level section if the perception volume level exceeds the predetermined level section, and applying a compensation gain to a loudness of the audio signal so that a perception volume level of the audio signal becomes a lower limit value in the predetermined level section if the perception volume level is less than the predetermined level section.

17. The method of claim 15, wherein the predetermined level section is adjusted based on at least one of a type of the audio signal, a current time, a surrounding noise level, and a user preference.

18. The method of claim 10, wherein the sound output apparatus is implemented as at least one of a woofer, a midrange speaker, and a tweeter.

\* \* \* \* \*